(12) United States Patent
Hu et al.

(10) Patent No.: US 9,679,913 B1
(45) Date of Patent: Jun. 13, 2017

(54) MEMORY STRUCTURE AND METHOD FOR MANUFACTURING THE SAME

(71) Applicant: MACRONIX INTERNATIONAL CO., LTD., Hsinchu (TW)

(72) Inventors: Chih-Wei Hu, Miaoli County (TW); Teng-Hao Yeh, Hsinchu (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 0 days.

(21) Appl. No.: 15/343,253

(22) Filed: Nov. 4, 2016

(51) Int. Cl.
H01L 27/115 (2017.01)
H01L 27/11582 (2017.01)
H01L 27/1157 (2017.01)

(52) U.S. Cl.
CPC .... H01L 27/11582 (2013.01); H01L 27/1157 (2013.01)

(58) Field of Classification Search
CPC .................................................. H01L 27/1157
USPC .................................. 257/326, 776; 438/129
See application file for complete search history.

(56) References Cited

U.S. PATENT DOCUMENTS

| 5,216,265 | A  | * | 6/1993  | Anderson | ........... | H01L 21/0217 |
|           |    |   |         |          |             | 257/301 |
| 5,251,168 | A  | * | 10/1993 | Chung | ................ | H01L 23/4951 |
|           |    |   |         |          |             | 257/E23.039 |
| 9,419,006 | B2 | * | 8/2016  | Cernea   |             |  |
| 2009/0034336 | A1 |  | 2/2009 | Kwak et al. | | |
| 2011/0115010 | A1 | * | 5/2011 | Shim | .................. | H01L 27/11565 |
|  |  |  |  |  |  | 257/314 |
| 2011/0121455 | A1 |  | 5/2011 | Yoon et al. | | |
| 2011/0199804 | A1 | * | 8/2011 | Son | ........... | G11O 5/04 |
|  |  |  |  |  |  | 365/51 |
| 2014/0097484 | A1 | * | 4/2014 | Seol | .................. | H01L 29/42332 |
|  |  |  |  |  |  | 257/324 |
| 2015/0131381 | A1 | * | 5/2015 | Rhie | ...................... | G11C 16/14 |
|  |  |  |  |  |  | 365/185.17 |
| 2015/0249093 | A1 | * | 9/2015 | Lee | .................... | H01L 27/11582 |
|  |  |  |  |  |  | 257/324 |
| 2015/0262878 | A1 | * | 9/2015 | Sato | .................... | H01L 25/074 |
|  |  |  |  |  |  | 257/777 |
| 2015/0262975 | A1 | * | 9/2015 | Kawato | ................ | H01L 25/0657 |
|  |  |  |  |  |  | 257/690 |
| 2016/0005746 | A1 |  | 1/2016 | Lee | | |
| 2016/0064075 | A1 | * | 3/2016 | Miyakawa | ......... | G11C 13/0021 |
|  |  |  |  |  |  | 365/51 |
| 2017/0040379 | A1 | * | 2/2017 | Sasago | ................ | G11C 13/0004 |
| 2017/0054074 | A1 | * | 2/2017 | Sasago | .................... | H01L 45/06 |

* cited by examiner

Primary Examiner — George Fourson, III
(74) Attorney, Agent, or Firm — McClure, Qualey & Rodack, LLP (57) ABSTRACT

A memory structure includes a 3D array of memory cells, a plurality of first conductive lines disposed on the 3D array, a plurality of second conductive lines disposed on the first conductive lines, a top metal plate disposed on the second conductive lines, and at least one strapping structure. The second conductive lines and the first conductive lines extend on different directions. The at least one strapping structure is configured for the first conductive lines and correspondingly disposed on at least one dummy region of the 3D array. Each strapping structure includes a connecting structure and a jumping line. The jumping line is disposed on and coupled to the connecting structure, and coupled to the top metal plate. The jumping line and the second conductive lines extend on the same direction.

20 Claims, 13 Drawing Sheets

MEMORY STRUCTURE AND METHOD FOR MANUFACTURING THE SAME

The disclosure relates to a memory structure and a method for manufacturing the same, and more particularly to a memory structure comprising a three-dimensional (3D) array of memory cells and a method for manufacturing the same.

BACKGROUND

It is beneficial that the conductive lines of a semiconductor device have low resistances. For example, in a memory device, a resistance of common source lines is preferably as low as possible, so as to avoid an additional IR drop that will induce a variation on the threshold voltage of memory cells. This can be easily achieved in a memory structure comprising a 2D array of memory cells by increasing the width of each common source line. However, in a memory structure comprising a 3D array of memory cells, in order to achieve high-density array, the room that can be provided for each conductive line is limited. As such, it is hard to provide a low-resistance conductive line by simply modifying the geometric sizes in such memory structure.

SUMMARY

In this disclosure, a memory structure with a decreased IR drop and a method for manufacturing the same are provided.

According to some embodiments, the memory structure comprises a 3D array of memory cells, a plurality of first conductive lines, a plurality of second conductive lines, a top metal plate, and at least one strapping structure. The 3D array comprises at least one dummy region disposed therein. The first conductive lines are disposed on the 3D array. The second conductive lines are disposed on the first conductive lines. The second conductive lines and the first conductive lines extend on different directions. The top metal plate is disposed on the second conductive lines. The at least one strapping structure is configured for the first conductive lines and correspondingly disposed on the at least one dummy region of the 3D array. Each of the at least one strapping structure comprises a connecting structure and a jumping line. The connecting structure is disposed on the dummy region. The jumping line is disposed on and coupled to the connecting structure. The jumping line is coupled to the top metal plate. The jumping line and the second conductive lines extend on the same direction.

According to some embodiments, the method comprises the following steps. First, a 3D array of memory cells is formed. The 3D array comprises at least one dummy region disposed therein. A plurality of first conductive lines are formed on the 3D array, and at least one connecting structure of at least one strapping structure configured for the first conductive lines is correspondingly formed on the at least one dummy region of the 3D array. A plurality of second conductive lines are formed on the first conductive lines, and at least one jumping line of the at least one strapping structure is formed on the at least one connecting structure. The at least one jumping line is coupled to the at least one connecting structure. The second conductive lines and the first conductive lines extend on different directions, and the at least one jumping line and the second conductive lines extend on the same direction. A top metal plate is formed on the second conductive lines and the at least one jumping line. The at least one jumping line is coupled to the top metal plate.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

DETAILED DESCRIPTION

A memory structure according to embodiments comprises a 3D array of memory cells, a plurality of first conductive lines, a plurality of second conductive lines, a top metal plate, and at least one strapping structure. The 3D array comprises at least one dummy region disposed therein. The first conductive lines are disposed on the 3D array. The second conductive lines are disposed on the first conductive lines. The second conductive lines and the first conductive lines extend on different directions. The top metal plate is disposed on the second conductive lines. The at least one strapping structure is configured for the first conductive lines and correspondingly disposed on the at least one dummy region of the 3D array. Each of the at least one strapping structure comprises a connecting structure and a jumping line. The connecting structure is disposed on the dummy region. The jumping line is disposed on and coupled to the connecting structure. The jumping line is coupled to the top metal plate. The jumping line and the second conductive lines extend on the same direction.

Now, with reference to FIGS. 1A-1B to FIGS. 5A-5C, various details of exemplarily memory structures according to embodiments will be described. For ease of illustration, the 3D array of memory cells in the memory structure is shown having a single gate vertical channel (SGVC) structure. Further, each string of the memory cells is shown being arranged in U-shape. According to some embodiments, the memory cells are NAND flash memory cells. However, a memory structure according to embodiments may comprise a suitable 3D memory array structure of any other types. It is to be noted that some elements may be omitted from the figures, and the elements in the figures may not reflect their real sizes and configurations.

Figure 1A:
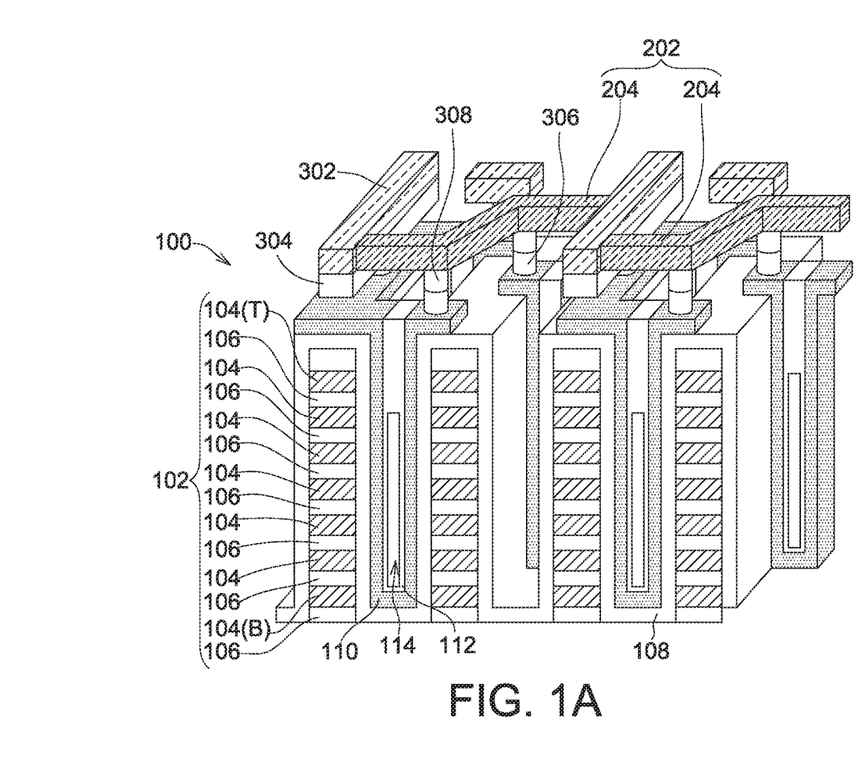
FIGS. 1A-1B to FIGS. 5A-5C illustrate the details of memory structures according to embodiments.
Figure 1B:
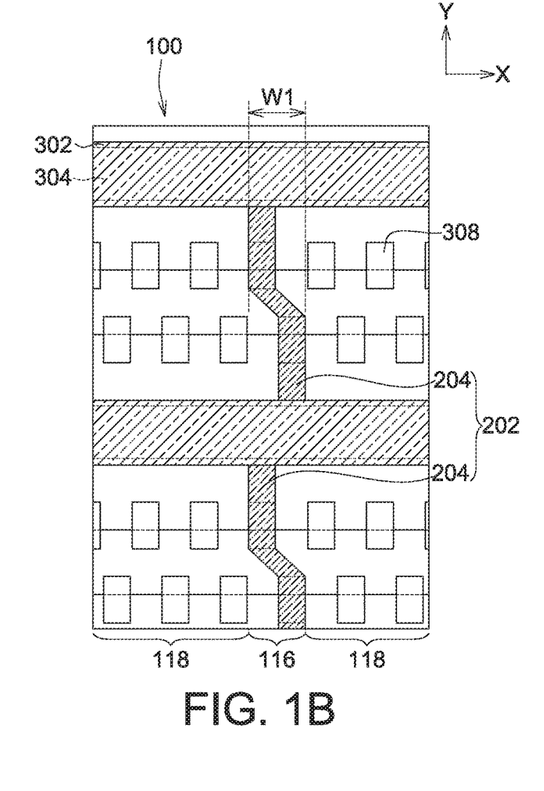

FIGS. 1A-1B show a 3D array 100 of memory cells, as well as a plurality of first conductive lines 302 and a connecting structure 202 of a strapping structure 200 disposed thereon, wherein FIG. 1A shows a perspective view from which some dielectric materials are removed for clarity, and FIG. 1B shows a top view.

According to some embodiments, as shown in the figures, the 3D array 100 has the SGVC structure and strings arranged in U-shape. More specifically, a plurality of stacks 102 are disposed on a substrate (not shown). Each stack 102 comprises conductive stripes 104 and insulating stripes 106 stacked alternately, wherein the conductive stripes 104 may be formed by poly-silicon, metal silicide or metal, and the insulating stripes 106 may be formed by oxide. According to some embodiments, the top conductive stripes 104(T) of adjacent two stacks 102 may be used as a ground select line and a string select line, respectively. In some embodiments, the bottom conductive stripes 104(B) are used as inversion gates. The other conductive stripes 104 may be word lines. A memory layer 108 is conformally disposed on the stacks 102 and surfaces of the substrate exposed from trenches between the stacks 102. The memory layer 108 may be an ONO (oxide-nitride-oxide) layer, a BE-SONOS (bandgap-engineered silicon-oxide-nitride-oxide-silicon) layer, or the like. A plurality of channel layers 110 are disposed on and along the memory layer 108 and separated from each other in each trench. The channel layers 110 may be thin layers formed of poly-silicon, and functioned as local bit lines. As such, the memory cells can be defined at the cross-points of the channel layers 110 and the conductive stripes 104, and thereby constitute the 3D array 100 of the memory cells. A dielectric material 112, such as oxide, is filled into the remaining spaces, and air gaps 114 may be formed in the dielectric material 112.

The 3D array 100 comprises at least one dummy region 116 disposed therein. The at least one dummy region 116 divides the 3D array 100 into sub-array regions 118. Preferably, the at least one dummy region 116 is arranged such that the 3D array 100 is equally divided into the sub-array regions 118. According to some embodiments, each sub-array regions 118 may comprise 200 to 20000 columns of the memory cells, and the adjacent dummy region may comprise 2 to 16 columns of the memory cells. The memory cells in the dummy region 116 may be substantially the same as the memory cells in the sub-array regions 118, and become "dummy" merely because the strapping structure disposed thereon make them losing the function as memory cells.

The first conductive lines 302 are disposed on the 3D array 100. The first conductive lines 302 may extend on a X-direction. In some embodiments, as shown in FIG. 1A, assistant conductive lines 304 are functioned as source sides, and formed directly under the first conductive lines 302 to improve the resistance performance. Plugs 306 can be used to couple the channel layers 110 to the first conductive lines 302. According to some embodiments, the first conductive lines 302 may be common source lines. In such cases, they may be coupled to the source side of the memory cells. According to some embodiments, the first conductive lines 302 have a sheet resistance $R_{fc}$ of about 1 to 10 $\Omega/\square$.

The connecting structure 202 of the strapping structure 200 is disposed on the dummy region 116 of the 3D array 100. According to some embodiments, the connecting structure 202 connects the first conductive lines 302. More specifically, as shown in FIG. 1B, the connecting structure 202 may comprise a plurality of connecting portions 204 each connects adjacent two first conductive lines 302. Preferably, the connecting structure 202 physically and electrically connects the first conductive lines 302. Since the dummy region 116 under the connecting structure 202 may comprise 2 to 16 columns of the memory cells, the connecting structure 202 may have a width W1 substantially across the 2 to 16 columns of the memory cells. The connecting structure 202 may be coupled to the channel layers 110 of the memory cells by the plugs 306 and contact vias 308, wherein the plugs 306 may be formed of poly-silicon, and the contact vias 308 may be formed of metal. The contact vias 308 may be disposed at the same level as the assistant conductive lines 304 and functioned as drain sides. According to some embodiments, the source sides and the drain sides are disposed on the dummy region 116, and one of the source sides and corresponding one of the drain sides are coupled to each other, such as through the corresponding first conductive line 302 and connecting portion 204.

Preferably, the connecting structure 202 and the first conductive lines 302 are disposed at the same level. More preferably, the connecting structure 202 and the first conductive lines 302 are formed by the same process by the same material.

Figure 2A:
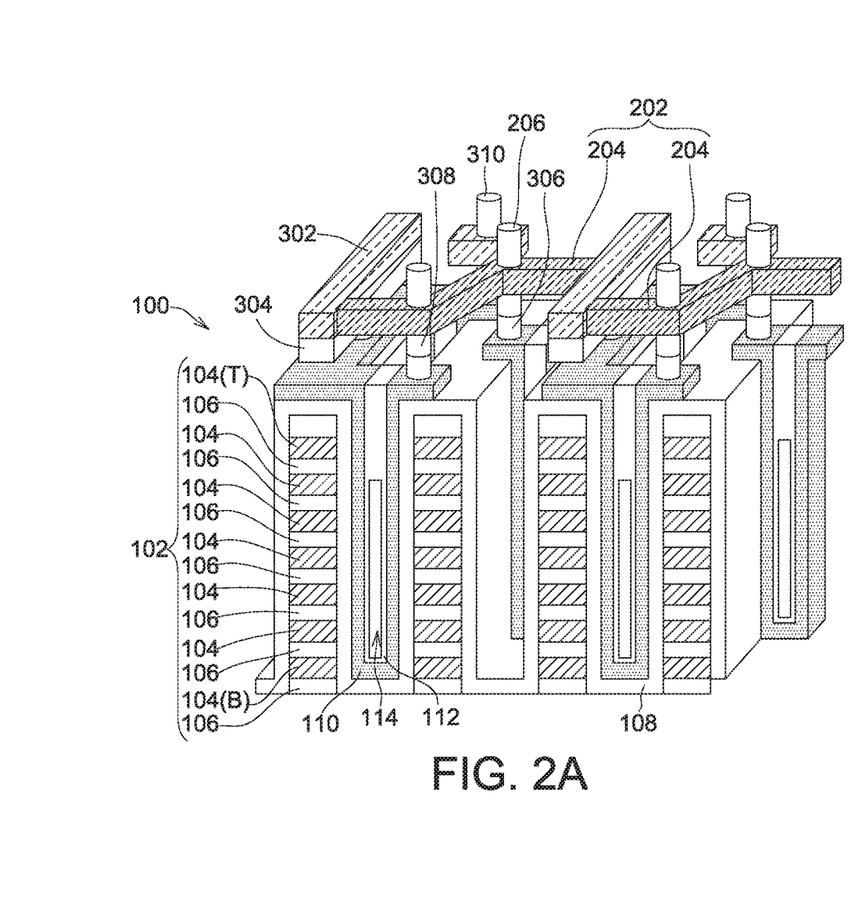
Figure 2B:
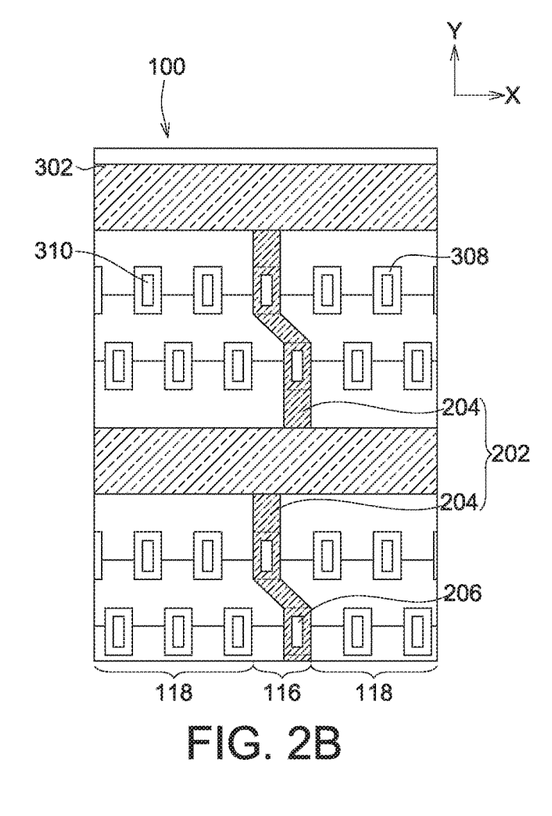

FIGS. 2A-2B show the components disposed at a level above the structure shown in FIGS. 1A-1B, wherein FIG. 2A shows a perspective view, and FIG. 2B shows a top view. The strapping structure 200 may further comprise a plurality of first jumping vias 206 coupling the connecting structure 202 to a jumping line 208 (shown in FIGS. 3A-3B) of the strapping structure 200. In addition, vias 310 for coupling the memory cells to overlying second conductive lines 312 (shown in FIGS. 3A-3B) may be formed by the same process by the same material as the first jumping vias 206.

Figure 3A:
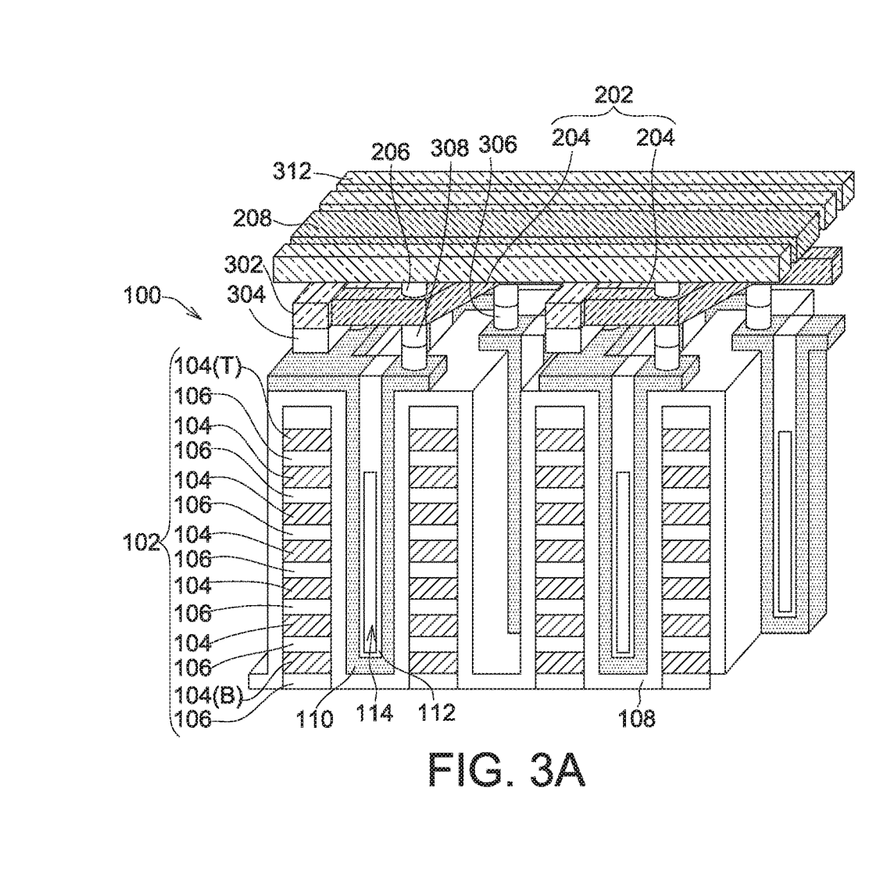
Figure 3B:
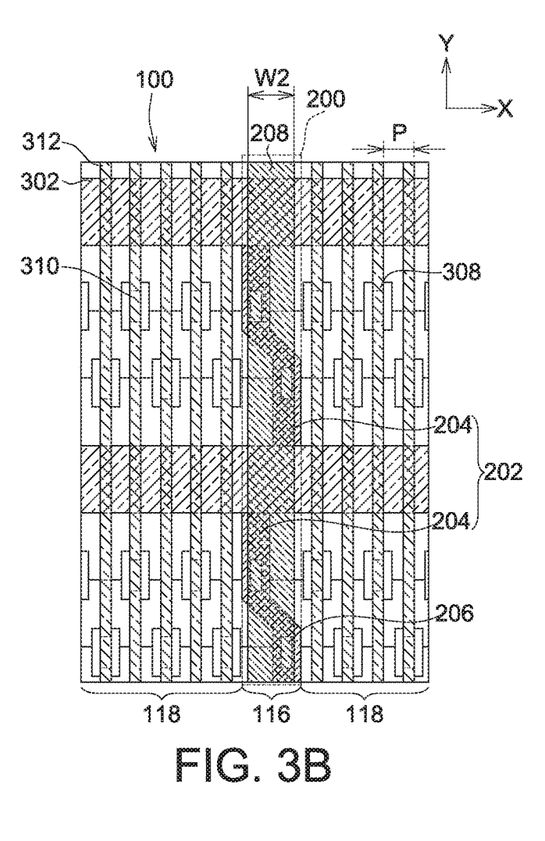
Figure 3C:
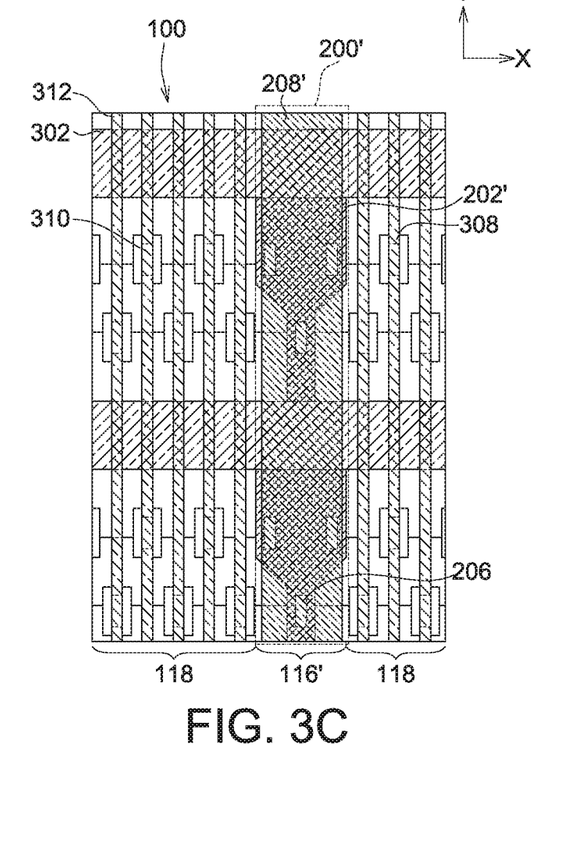
Figure 3D:
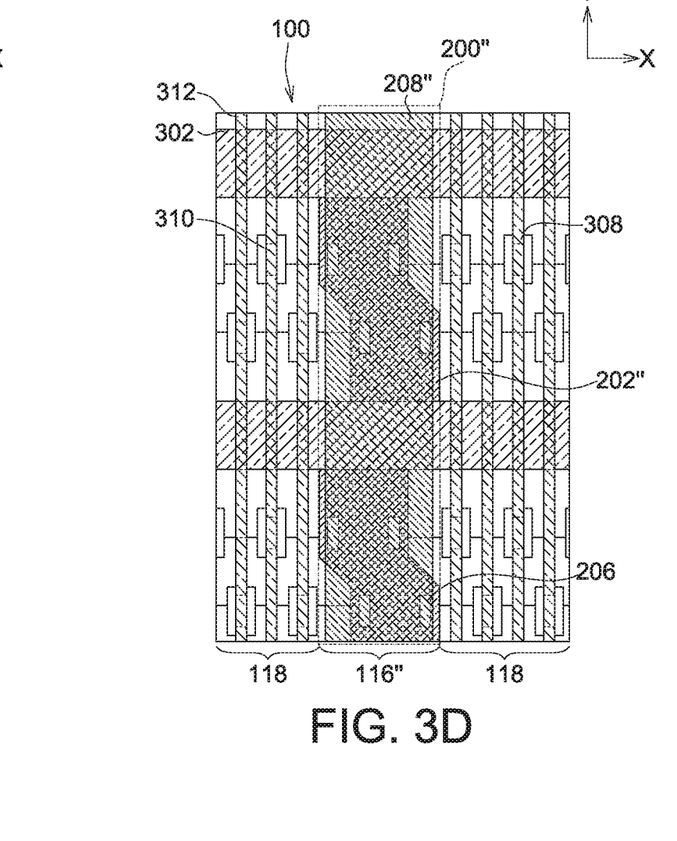

FIGS. 3A-3B show a plurality of second conductive lines 312 and a jumping line 208 of the strapping structure 200 disposed at a level above the structure shown in FIGS. 2A-2B, wherein FIG. 3A shows a perspective view, and FIG. 3B shows a top view.

The second conductive lines 312 are disposed on the first conductive lines 302. The second conductive lines 312 and the first conductive lines 302 extend on different directions. In some embodiments, the extending directions of the second conductive lines 312 and the first conductive lines 302 are substantially perpendicular to each other. The second conductive lines 312 may extend on a Y-direction. According to some embodiments, the second conductive lines 312 may be global bit lines. In such cases, they may be coupled to the drain side of the memory cells. According to some embodiments, the second conductive lines 312 have a sheet resistance $R_{sc}$ of about 1 to 10 $\Omega/\square$.

The jumping line 208 of the strapping structure 200 is disposed on and coupled to the connecting structure 202. The jumping line 208 may be coupled to the connecting structure 202 by the first jumping vias 206. The jumping line 208 is coupled to a top metal plate 314 (shown in FIGS. 5A-5B). The jumping line 208 and the second conductive lines 312 extend on the same direction. According to some embodiments, a ratio of a number of the second conductive lines 312 to a total number of the jumping lines 208 is in a range between 200:1 and 20000:1, such as 512:1, 1024:1, 2048:1 or the like. In addition, similar to the connecting structure 202, the jumping line 208 may have a width W2 substantially across the 2 to 16 columns of the memory cells. From another aspect of view, the jumping line 208 of the strapping structure 200 may have a width W2 substantially equal to 2 to 16 times of a pitch P of the second conductive lines 312 since each second conductive line corresponds to a column of the memory cell.

Preferably, the jumping line 208 and the second conductive lines 312 are disposed at the same level. More preferably, the jumping line 208 and the second conductive lines 312 are formed by the same process by the same material.

In FIGS. 1A-1B to 3A-3B, the dummy region 116 comprising 2 columns of the memory cells and the strapping structure 200 correspondingly across the 2 columns of the memory cells are shown. Alternative embodiments are illustrated in FIG. 3C and FIG. 3D. In FIG. 3C, the dummy region 116' comprises 3 columns of the memory cells, and the connecting structure 202' and the jumping line 208' of the strapping structure 200' correspondingly across the 3 columns of the memory cells. In FIG. 3D, the dummy region 116" comprises 4 columns of the memory cells, and the connecting structure 202" and the jumping line 208" of the strapping structure 200" correspondingly across the 4 columns of the memory cells.

Figure 4A:
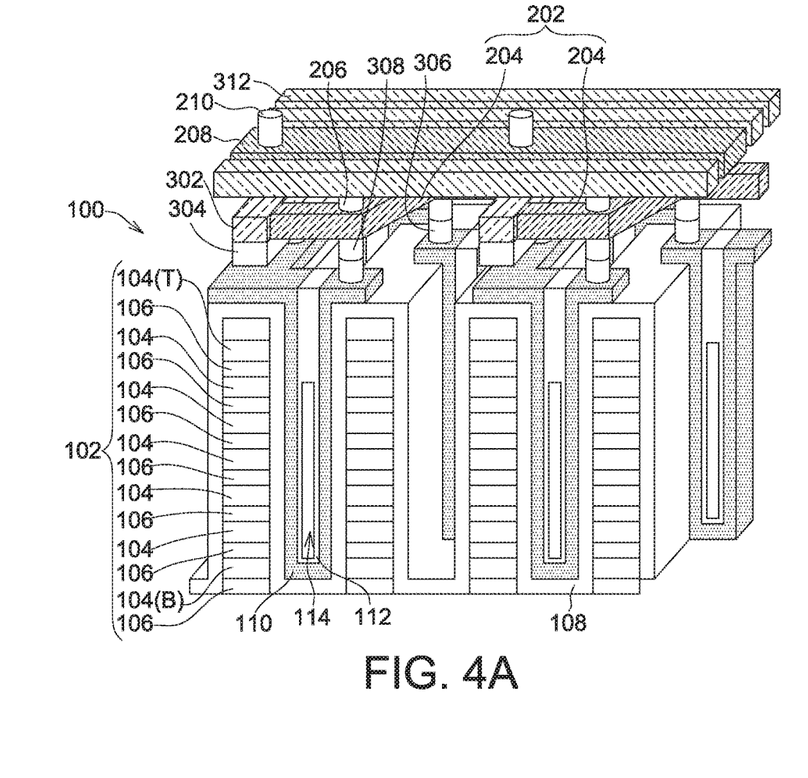
Figure 4B:
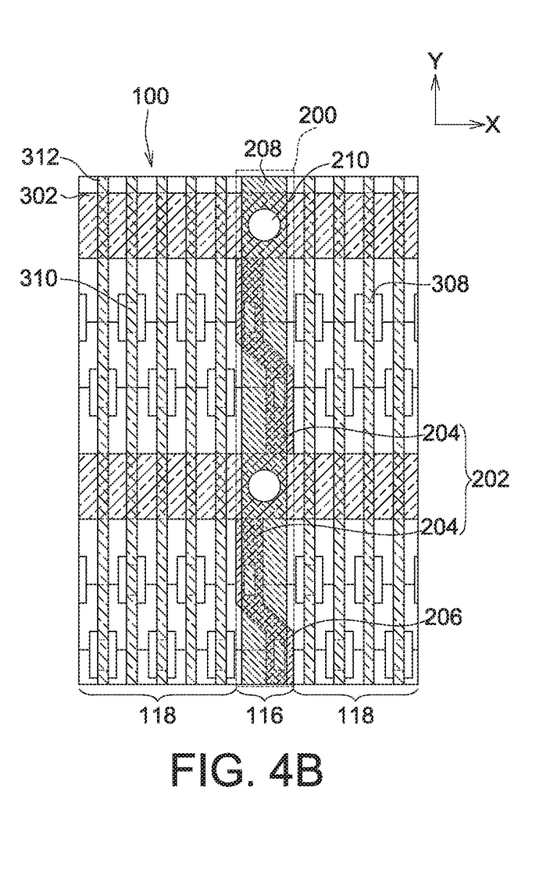

FIGS. 4A-4B show the components disposed at a level above the structure shown in FIGS. 3A-3B, wherein FIG. 4A shows a perspective view, and FIG. 4B shows a top view. The strapping structure 200 may further comprise a plurality of second jumping vias 210 for the coupling of the jumping line 208. In some embodiments, the second jumping vias 210 couple the jumping line 208 to the top metal plate 314 (such as the case shown in FIG. 5A). In some embodiments, the second jumping vias 210 couple the jumping line 208 to some third conductive lines 316 (such as the case shown in FIG. 5C).

Figure 5A:
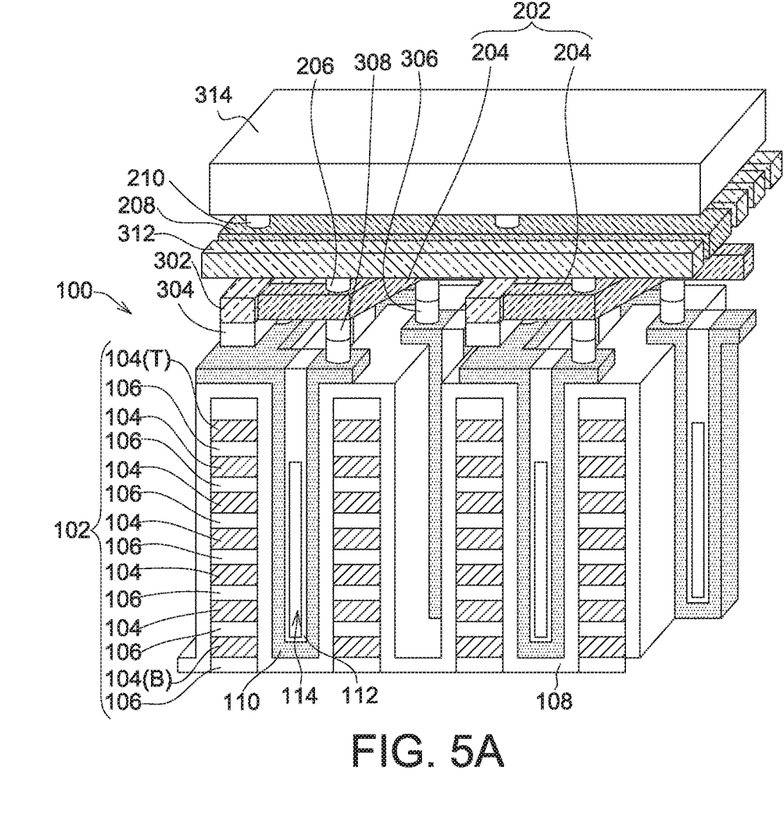
Figure 5B:
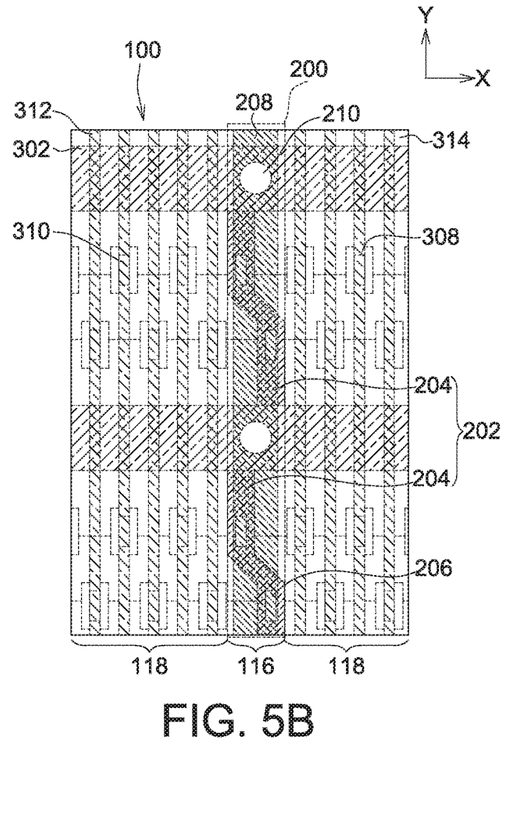

FIGS. 5A-5B show a top metal plate 314 disposed on the second conductive lines 312, wherein FIG. 5A shows a perspective view in which a current path is illustrated, and FIG. 5B shows a top view. According to some embodiments, the top metal plate 314 has a sheet resistance $R_{tm}$ of about 0.01 to 0.1Ω/□. Preferably, the sheet resistance $R_{tm}$ of the top metal plate 314 and the sheet resistance $R_{fc}$ of the first conductive lines 302 substantially satisfy the equation: $R_{tm} < 0.1 \times R_{fc}$. More preferably, the sheet resistances $R_{tm}$ and $R_{fc}$ substantially satisfy the equation: $R_{tm} \leq 0.01 \times R_{fc}$. As such, compared to the sheet resistance $R_{fc}$ of the first conductive lines 302, the sheet resistance $R_{tm}$ of the top metal plate 314 can be neglected. It means that, once the current is transferred to the top metal plate 314, the resistance is not a critical problem anymore. By introducing at least one strapping structure 200 that leading the currents in the first conductive lines 302 to the top metal plate 314, the loading of the first conductive lines 302 can be mitigated significantly. Thereby, the effect of the IR drop to the threshold voltage is decreased.

Figure 5C:
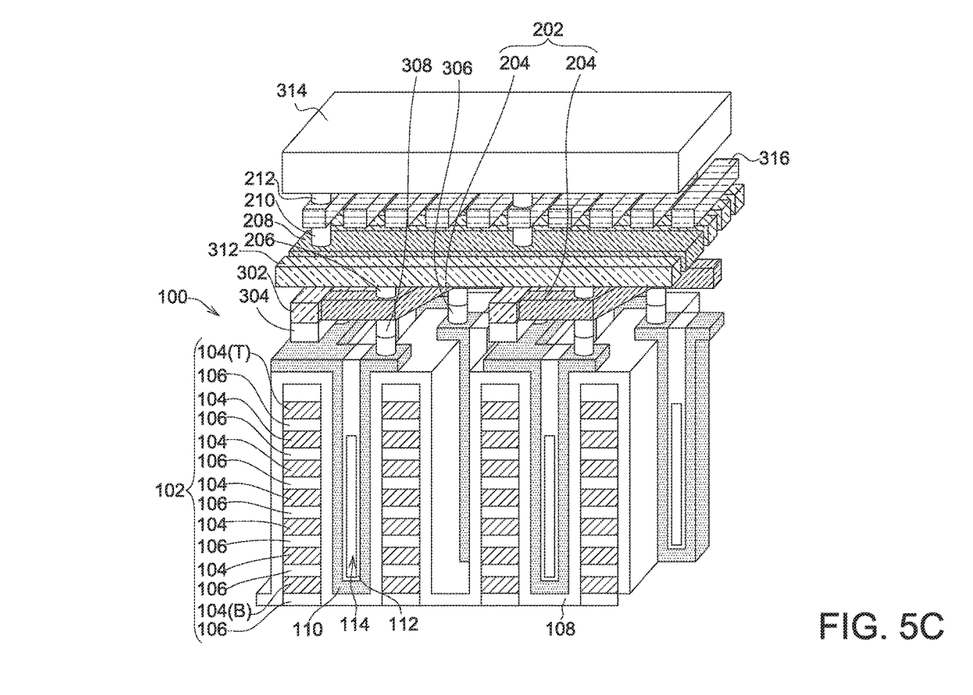

In some embodiments, other components may be disposed between the second conductive lines 312 and the top metal plate 314. For example, as shown in FIG. 5C, the memory structure may further comprise a plurality of third conductive lines 316 disposed on the second conductive lines 312. The top metal plate 314 is disposed on the third conductive lines 316. The third conductive lines 316 and the second conductive lines 312 extend on different directions. According to some embodiments, the third conductive lines 316 may extend on the same direction as the first conductive lines 302. In the case that the third conductive lines 316 are formed, the second jumping vias 210 may couple the jumping line 208 to portions of the third conductive lines 316 (such as some of the third conductive lines 316). The strapping structure 200 may further comprise a plurality of third jumping vias 212 coupling the portions of the third conductive lines 316 to the top metal plate 314.

Figure 6:
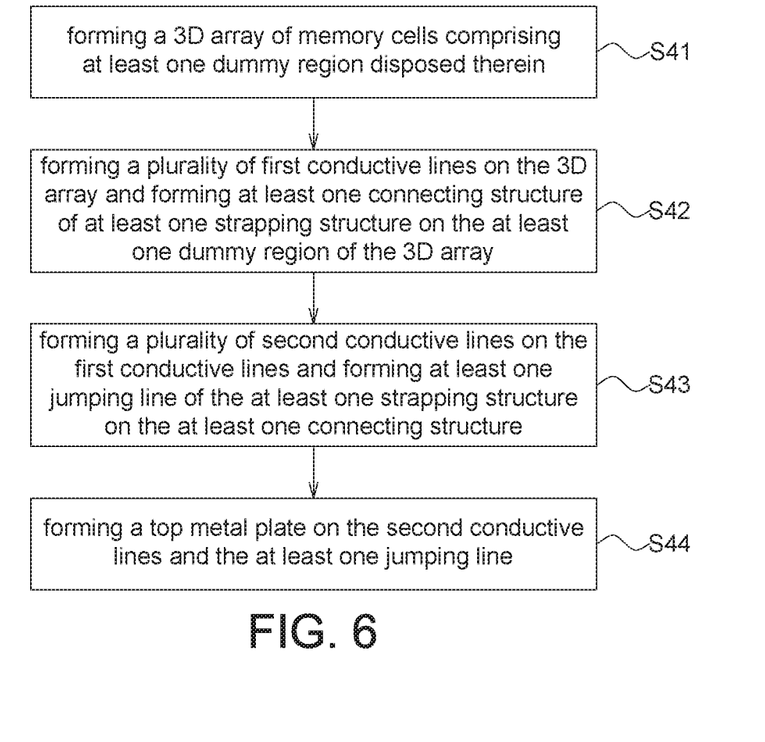
FIG. 6 is a flow diagram of a method for manufacturing the memory structure according to embodiments.

Now referring to FIG. 6, the flow sequence of a method for manufacturing the memory structure according to embodiments is shown. In step S41, a 3D array of memory cells is formed. The 3D array comprises at least one dummy region disposed therein. In step S42, a plurality of first conductive lines are formed on the 3D array, and at least one connecting structure of at least one strapping structure, which is configured for the first conductive lines, is correspondingly formed on the at least one dummy region of the 3D array. In step S43, a plurality of second conductive lines are formed on the first conductive lines, and at least one jumping line of the at least one strapping structure is formed on the at least one connecting structure. An exemplary process for this step will be illustrated in details in the following paragraph. The at least one jumping line is coupled to the at least one connecting structure. The second conductive lines and the first conductive lines extend on different directions, and the at least one jumping line and the second conductive lines extend on the same direction. In step S44, a top metal plate is formed on the second conductive lines and the at least one jumping line. The at least one jumping line is coupled to the top metal plate. Other steps, such as the step for forming the first jumping vias and the like, may be carried out as needed.

Figure 7A:
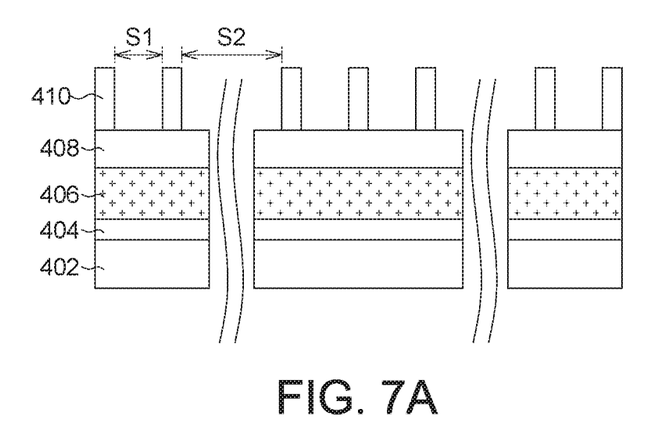
FIGS. 7A-7B to FIGS. 10A-10B illustrate an exemplarily process for manufacturing the jumping lines and the second conductive lines of memory structures according to embodiments.
Figure 7B:
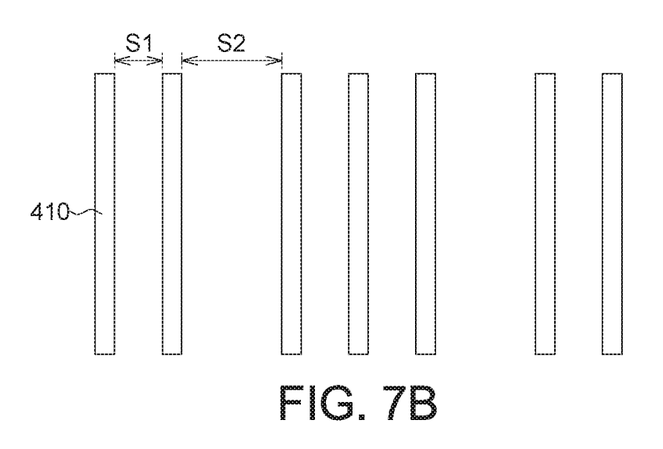
Figure 8A:
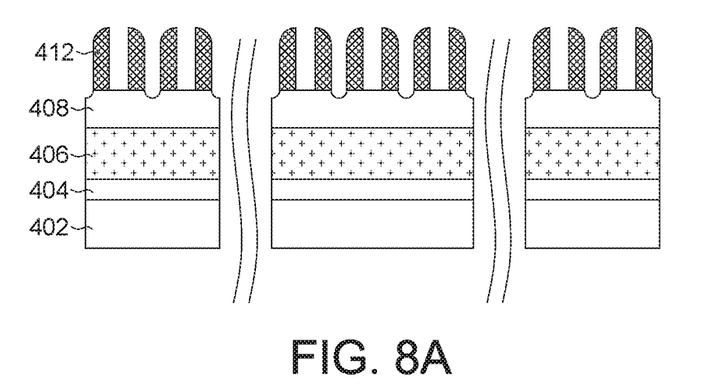
Figure 8B:
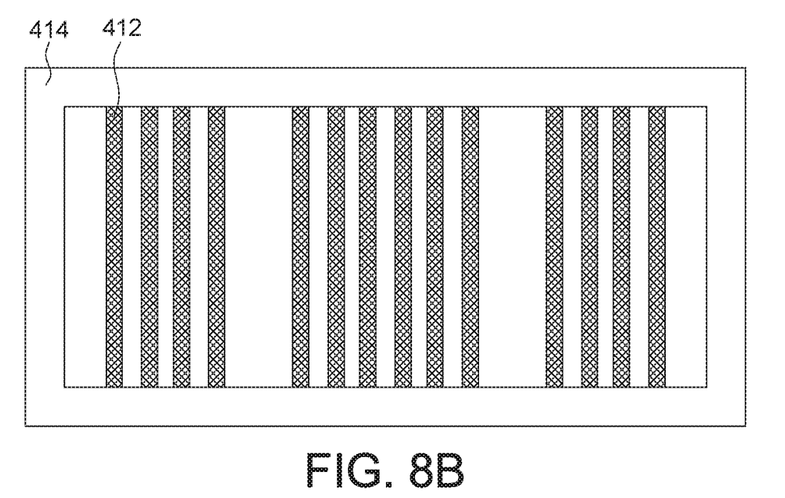
Figure 9A:
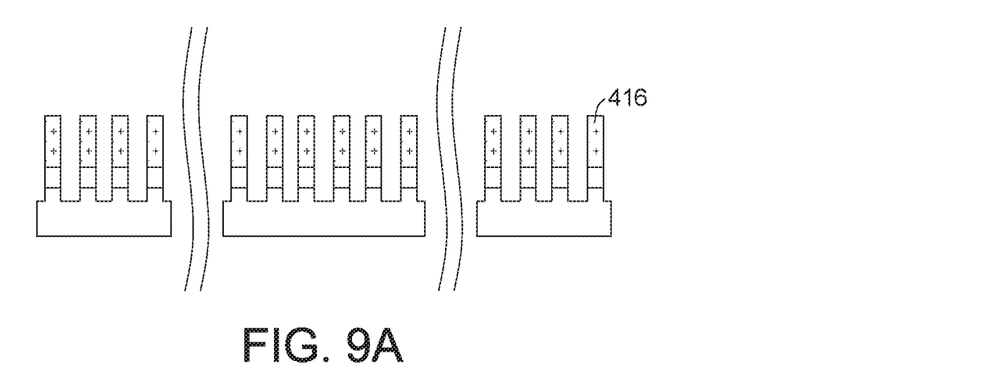
Figure 9B:
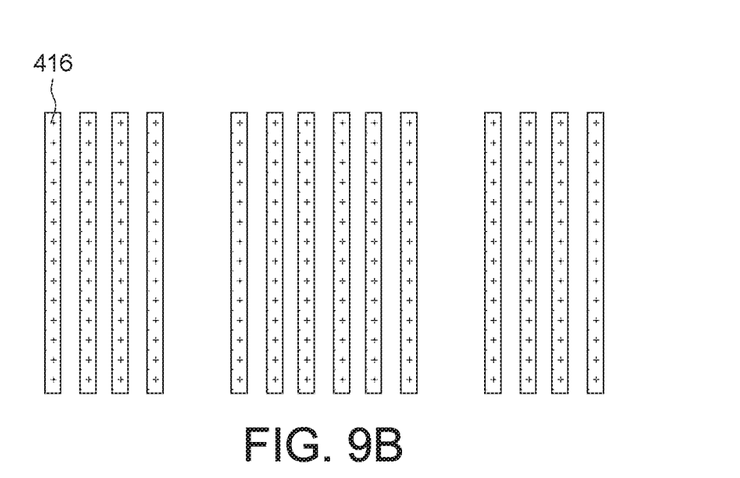
Figure 10A:
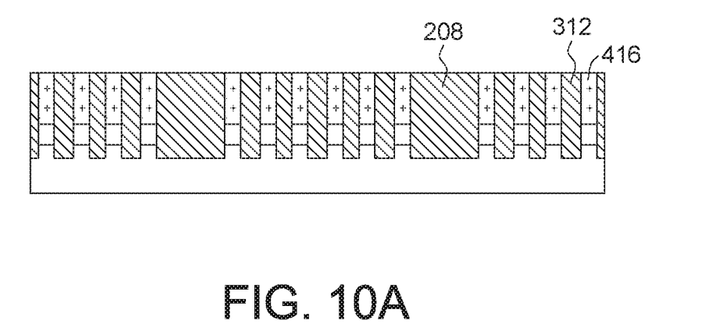
Figure 10B:
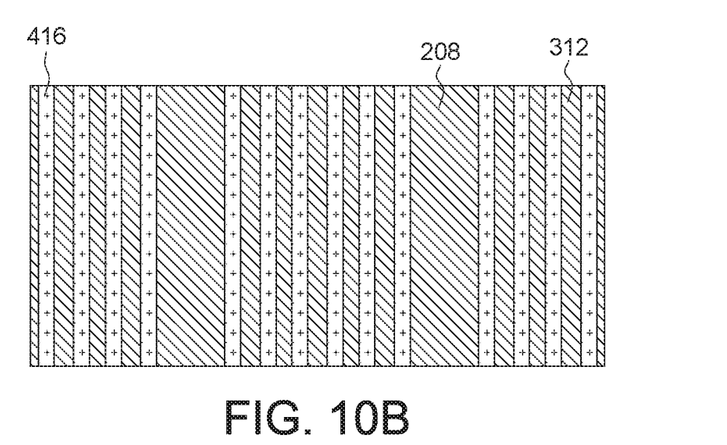

FIGS. 7A-7B to 10A-10B show an exemplary process for forming the and the second conductive lines and the jumping lines, wherein FIGS. 7A, 8A, 9A and 10A show cross-sectional views, and FIGS. 7B, 8B, 9B and 10B show corresponding top views. The self-aligned double patterning technique is used in the exemplary process. As shown in FIGS. 7A-7B, on an underlying structure 402, several layers 404, 406 and 408 may be formed sequentially. The layer 404 may be formed of silicon nitride, the layer 406 may be formed of oxide, and the layer 408 may be a hard mask layer formed of amorphous silicon. A plurality of place holders 410 are formed on the layer 408. The place holders 410 may be formed of APF film. As shown in FIGS. 7A-7B, the place holders 410 are spaced apart from each other with two kinds of spaces S1 and S2, wherein the space S1 is designed for the formation of the regular second conductive lines 312, and the space S2 is designed for the formation of the jumping lines 208. For example, in the case that the dummy region 116 comprises 2 columns of the memory cells, the space S2 may be 1.5 times of the pitch P of the second conductive lines 312. While for the dummy region 116 comprises 3 columns of the memory cells, the space S2 may be 2.5 P. For the dummy region 116 comprises 4 columns of the memory cells, the space S2 may be 3.5 P. Then, spacers 412 are formed on sidewalls of the place holders 410, and the place holders 410 are removed, as shown in FIGS. 8A-8B. In some embodiments, a mask 414 for the peripheral region of the memory structure may be provided thereafter. By the following steps, the pattern of the spacers 412 is transferred to the underlying layers, and intra-layer dielectrics 416 are formed, as shown in FIGS. 9A-9B. Then the conductive material is filled into the trenches between the intra-layer dielectrics 416, and thereby the second conductive lines 312 and the jumping lines 208 are formed, as shown in FIGS. 10A-10B.

It is to be appreciated that the process for manufacturing the memory structure according to embodiments is compatible with the typical process for manufacturing memory structures. More specifically, only the process for forming a few levels, such as the level of the first conductive lines 302, the level of the second conductive lines 312 and the level of the second jumping vias 210, needs to be modified. As such, the modification will not lead to an unacceptable increase in the cost and the manufacturing time.

Now referring to FIGS. 11A-11C, the decrease of the IR drop will be explained with reference to the comparative memory structure shown in FIG. 11A and memory structures according to embodiments shown in FIGS. 11B and 11C.

Figure 11A:
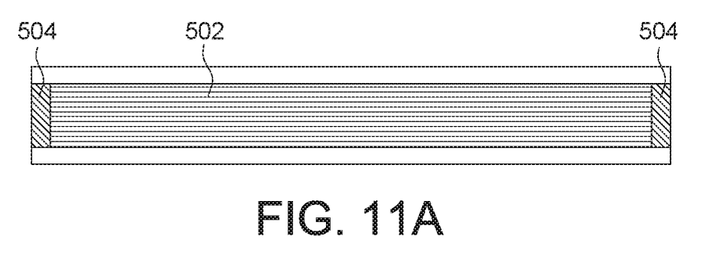
FIGS. 11A-11C illustrate exemplarily arrangements of strapping structures of a comparative memory structure and memory structures according to embodiments.

As shown in FIG. 11A, at two sides of a sub-array region 502, word line pad regions 504 may be disposed, respectively. Such word line pad regions 504 may also provide a strapping function to the first conductive lines. However, a word line pad region 504 needs the room of about 5 to 10 um. The disposition of additional word line pad regions 504 is space-consuming for the memory structure. Hereinafter, the current and the resistance across the sub-array region 502 shown in FIG. 11A are defined as I and R, respectively.

Figure 11B:
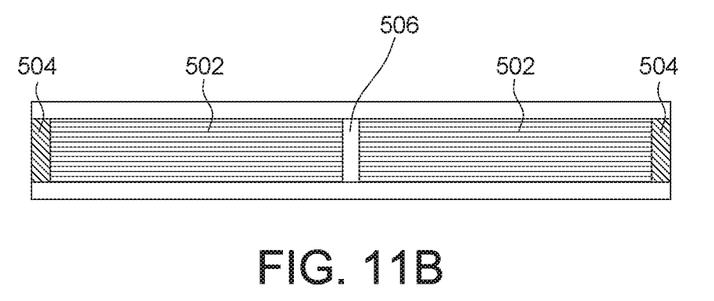

In the case of FIG. 11B, a strapping structure 506 is disposed and divides the sub-array region 502 shown in FIG. 11A into two sub-array regions 502. The room that a strapping structure 506 needs may be as small as about 0.1 um, much less than a word line pad region 504. The overhead for such a strapping structure 506 is neglectable. Since the first conductive lines as common source line are used to collect the string currents, the current in the first conductive lines is proportional to the number of the columns of the memory cells between two structures having the strapping function. As such, by introducing a strapping structure 506 as shown in FIG. 11B, the current in the first conductive lines decreases to I/2. Further, the resistance is proportional to the passing length, thereby proportional to the number of the columns of the memory cells between two structures having the strapping function, too. As such, by introducing a strapping structure 506 as shown in FIG. 11B, the resistance decreases to R/2. It means that the loading of the first conductive lines can decrease to ¼ as compared to the case shown in FIG. 11A.

Figure 11C:
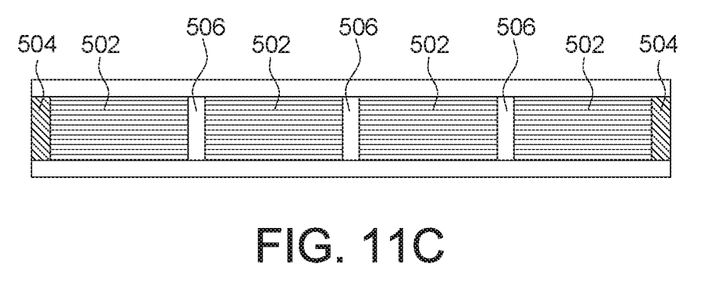

Similarly, in the case of FIG. 11C, three strapping structure 506 divide the sub-array region 502 shown in FIG. 11A into four sub-array regions 502, and thereby the loading of the first conductive lines can decrease to 1/16 as compared to the case shown in FIG. 11A.

It will be apparent to those skilled in the art that various modifications and variations can be made to the disclosed embodiments. It is intended that the specification and examples be considered as exemplary only, with a true scope of the disclosure being indicated by the following claims and their equivalents.

What is claimed is:

1. A memory structure, comprising:
   a 3D array of memory cells, the 3D array comprising at least one dummy region disposed therein;
   a plurality of first conductive lines disposed on the 3D array;
   a plurality of second conductive lines disposed on the first conductive lines, wherein the second conductive lines and the first conductive lines extend on different directions;
   a top metal plate disposed on the second conductive lines; and
   at least one strapping structure configured for the first conductive lines and correspondingly disposed on the at least one dummy region of the 3D array, each of the at least one strapping structure comprising:
      a connecting structure disposed on the dummy region; and
      a jumping line disposed on and coupled to the connecting structure, the jumping line coupled to the top metal plate, wherein the jumping line and the second conductive lines extend on the same direction.

2. The memory structure according to claim 1, wherein the connecting structure of the each of the at least one strapping structure connects the first conductive lines.

3. The memory structure according to claim 2, wherein the each of the at least one strapping structure further comprises:
   a plurality of first jumping vias coupling the connecting structure to the jumping line.

4. The memory structure according to claim 3, wherein the each of the at least one strapping structure further comprises:
   a plurality of second jumping vias coupling the jumping line to the top metal plate.

5. The memory structure according to claim 3, further comprising:
   a plurality of third conductive lines disposed on the second conductive lines, wherein the top metal plate is disposed on the third conductive lines, and wherein the third conductive lines and the second conductive lines extend on different directions.

6. The memory structure according to claim 5, wherein the each of the at least one strapping structure further comprises:
   a plurality of second jumping vias coupling the jumping line to portions of the third conductive lines; and
   a plurality of third jumping vias coupling the portions of the third conductive lines to the top metal plate.

7. The memory structure according to claim 1, wherein a sheet resistance $R_{tm}$ of the top metal plate and a sheet resistance $R_{fc}$ of the first conductive lines substantially satisfy the equation:

$$R_{tm} < 0.1 \times R_{fc}.$$

8. The memory structure according to claim 7, wherein the sheet resistance $R_{tm}$ of the top metal plate and the sheet resistance $R_{fc}$ of the first conductive lines substantially satisfy the equation:

$$R_{tm} \leq 0.01 \times R_{fc}.$$

9. The memory structure according to claim 1, wherein the connecting structure of the each of the at least one strapping structure and the first conductive lines are disposed at the same level, and the jumping line of the each of the at least one strapping structure and the second conductive lines are disposed at the same level.

10. The memory structure according to claim 1, wherein a ratio of a number of the second conductive lines to a total number of the jumping line of the at least one strapping structure is in a range between 200:1 and 20000:1.

11. The memory structure according to claim 1, wherein each of the at least one dummy region of the 3D array comprises 2 to 16 columns of the memory cells, and the connecting structure and the jumping line of the each of the at least one strapping structure have widths across the 2 to 16 columns of the memory cells.

12. The memory structure according to claim 1, wherein the jumping line of the each of the at least one strapping structure has a width substantially equal to 2 to 16 times of a pitch of the second conductive lines.

13. The memory structure according to claim 1, wherein the first conductive lines are common source lines, and the second conductive lines are global bit lines.

14. The memory structure according to claim 1, further comprising:
   assistant conductive lines formed directly under the first conductive lines, the assistant conductive lines functioned as source sides; and
   contact vias disposed at the same level as the assistant conductive lines and configured for coupling the connecting structures of the at least one strapping structure to the channel layers of the memory cells, the contact vias functioned as source sides.

15. The memory structure according to claim 14, wherein the source sides and the drain sides are disposed on the at least one dummy region of the 3D array, and one of the source sides and corresponding one of the drain sides are coupled to each other.

16. The memory structure according to claim 1, wherein the 3D array has a single gate vertical channel structure.

17. The memory structure according to claim 13, wherein each string of the memory cells is arranged in U-shape.

18. A method for manufacturing a memory structure, comprising:

forming a 3D array of memory cells, the 3D array comprising at least one dummy region disposed therein;

forming a plurality of first conductive lines on the 3D array and forming at least one connecting structure of at least one strapping structure configured for the first conductive lines correspondingly on the at least one dummy region of the 3D array;

forming a plurality of second conductive lines on the first conductive lines and forming at least one jumping line of the at least one strapping structure on the at least one connecting structure, wherein the at least one jumping line is coupled to the at least one connecting structure, and wherein the second conductive lines and the first conductive lines extend on different directions, and the at least one jumping line and the second conductive lines extend on the same direction; and forming a top metal plate on the second conductive lines and the at least one jumping line, wherein the at least one jumping line is coupled to the top metal plate.

19. The method according to claim 18, wherein the second conductive lines and the at least one jumping line are formed by self-aligned double patterning technique.

20. The method according to claim 19, wherein place holders used in the self-aligned double patterning technique are spaced apart from each other with two kinds of spaces S1 and S2, wherein the space S1 is designed for the formation of the second conductive lines, and the space S2 is designed for the formation of the at least one jumping line.

* * * * *